United States Patent [19]

Silberberg

[11] 4,346,346

[45] Aug. 24, 1982

[54] INSTRUMENT FOR MEASURING TRUE-RMS A.C. VOLTAGE AND A.C. VOLTAGE FLUCTUATIONS

[75] Inventor: Jeffrey L. Silberberg, Rockville, Md.

[73] Assignee: The United States of America as represented by the Department of Health, Education and Welfare, Washington, D.C.

[21] Appl. No.: 118,969

[22] Filed: Feb. 5, 1980

[51] Int. Cl.³ .................... G01R 15/10; G01R 19/02
[52] U.S. Cl. ................................... 324/132; 328/144; 364/483
[58] Field of Search ............... 324/132, 115, 73 R; 364/483; 328/144; 307/229

[56] References Cited
U.S. PATENT DOCUMENTS
3,845,388 10/1974 Ley et al. ............................ 324/132

Primary Examiner—Ernest F. Karlsen

Attorney, Agent, or Firm—Browdy and Neimark

[57] ABSTRACT

A line voltage monitor which can measure d.c. and RMS a.c. voltage and frequency, maximum and minimum RMS voltage, which displays input voltage, and computes and displays % regulation from the measured maximum and minimum voltage values. Analog input circuitry attenuates and squares the input voltage. A voltage-to-frequency converter produces logic pulses at a rate proportional to the squared signal. A 16-bit counter integrates $V^2$ by accumulating pulses from the voltage-to-frequency converter. A second 16-bit counter increments at a 1 MHz rate to determine the cycle period T of the input. A microcomputer divides the $\int V^2$ value by the period T and then takes the square root, yielding the RMS value of the input voltage. The microcomputer can be switched to determine the % regulation and the input frequency, and can be used to enable display of $V_{max}$, $V_{RMS}(t)$ or $V_{min}$, as well as the regulation.

16 Claims, 14 Drawing Figures

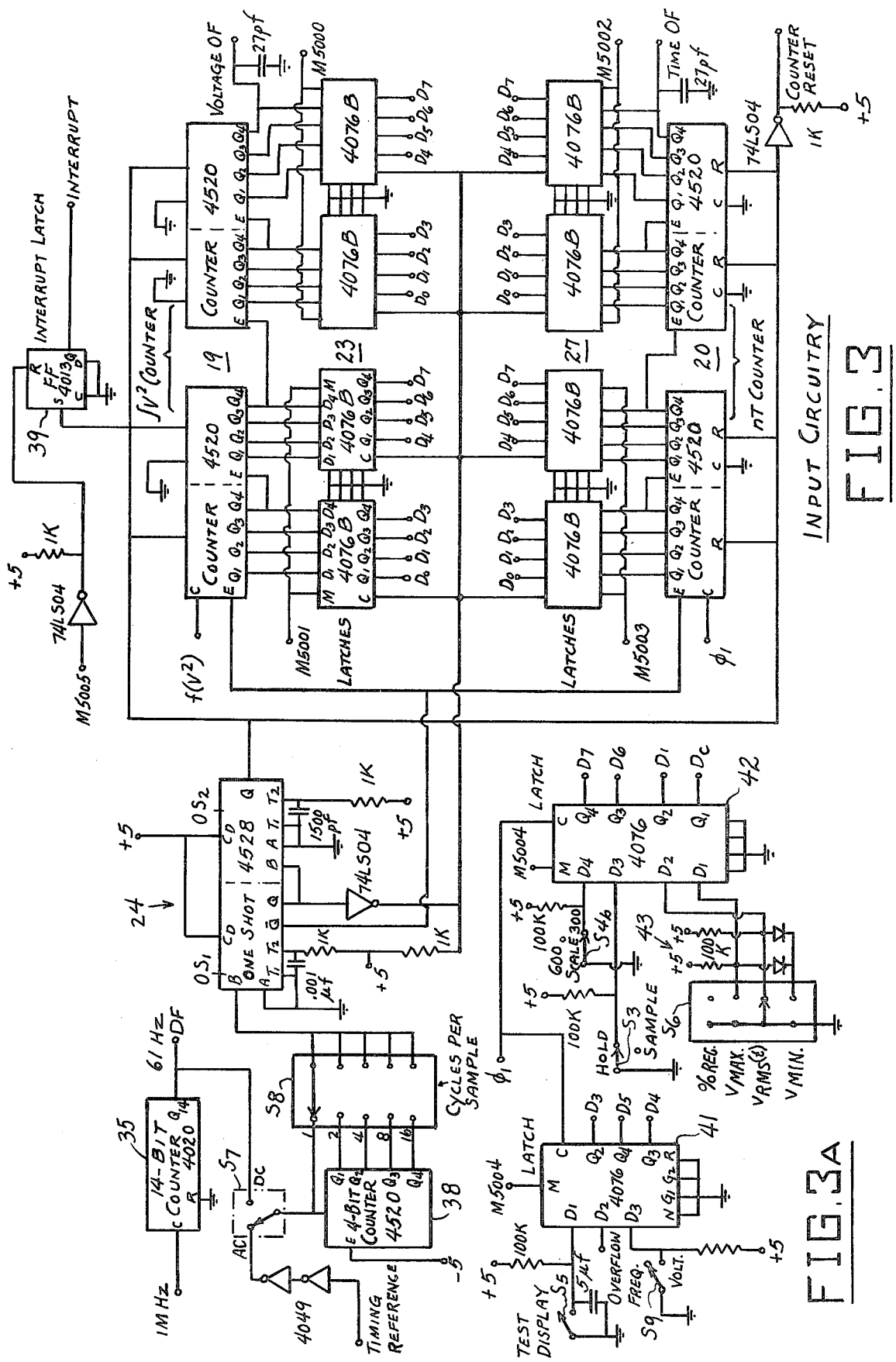

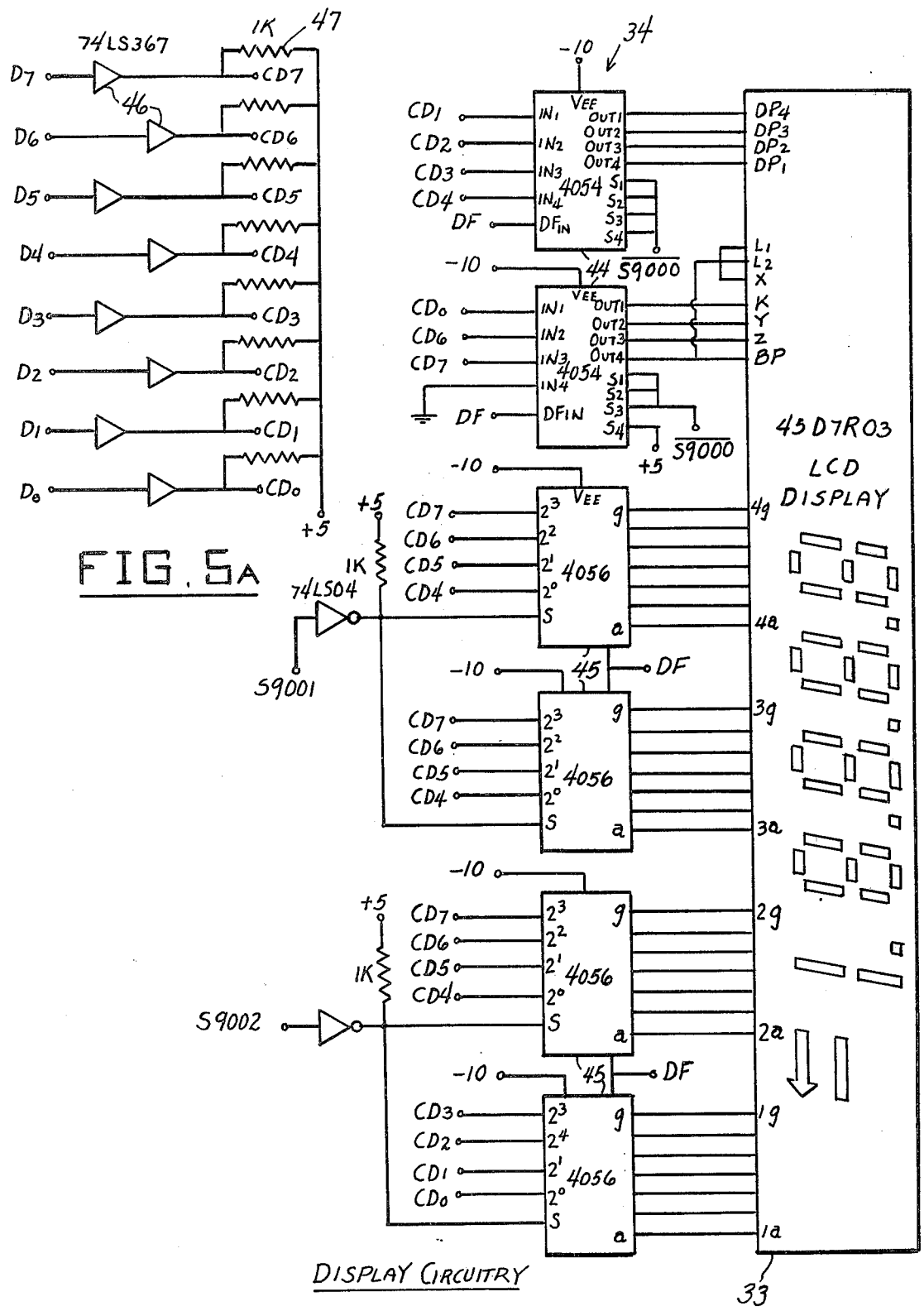

MICROCOMPUTER HARDWARE

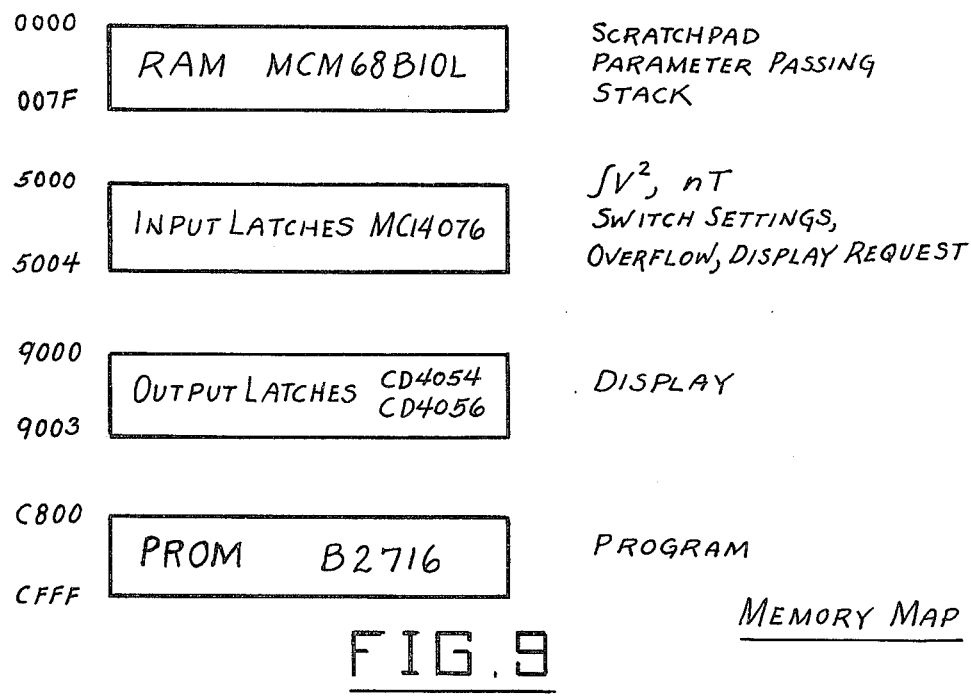
FIG. 9  MEMORY MAP
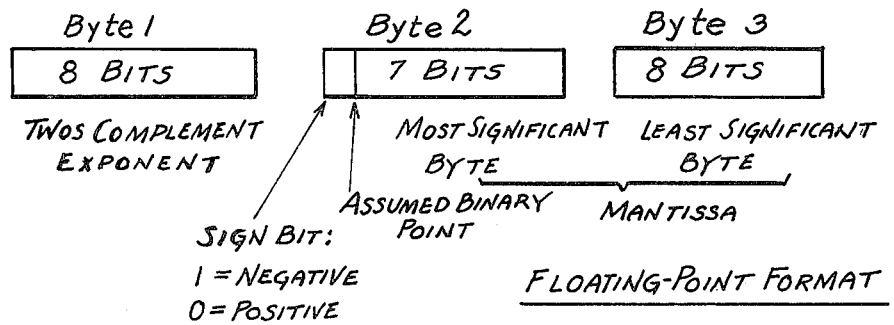
FIG. 10  ADDRESS LAYOUT
FIG. 11  FLOATING-POINT FORMAT

INSTRUMENT FOR MEASURING TRUE-RMS A.C. VOLTAGE AND A.C. VOLTAGE FLUCTUATIONS

FIELD OF THE INVENTION

This invention relates to devices for measuring fluctuations in alternating current voltage, and more particularly to instruments for measuring true-RMS line voltages, frequency and percent regulation in connection with measurements required in the testing of diagnostic X-ray equipment and similar apparatus.

BACKGROUND OF THE INVENTION

Under P.L. 90–602, "The Radiation Control for Health and Safety Act of 1968", there is a need for suitable portable equipment for making measurements connected with the testing of diagnostic X-ray equipment for compliance with this Act, for example, measurements to test the ability of the AC power supply to meet the equipment's minimum requirements, as specified by the manufacturer. Specifically, there is a need to measure accurately the true-RMS voltage, frequency, and percent regulation of the AC power supply, and to obtain clear displays of this information. Previously employed measuring equipment suffered from lack of adequate resolution and accuracy, limited voltage range, lack of means to compute percent regulation, and degradation of voltage accuracy with variation of the input frequency. Thus, there is a need for portable measuring equipment which can record small voltage changes, for example, as small as 0.1 volt, which can accurately compute percent regulation, and which can measure inputs at least from about 16 Hz to about 1.6 kHz.

A preliminary search of the prior art revealed the following prior U.S. Pat. Nos. of interest:
Wright, 3,205,347,
Platzer et al, 3,423,578,
Plante, 3,657,528,
Engel, 3,743,949,
Allen, 3,840,813,
Silberberg, 4,006,413,
Funk, 4,080,568,
Buhlmann, 4,125,895.

SUMMARY OF THE INVENTION

The instrument of the present invention may be employed for examining AC supply performance through determination of line voltage regulation, as specified for example in 21 CFR 1020.30, "Performance Standards for Electronic Products: Diagnostic X-ray Systems and their Major Components", promulgated under P.L. 90–602, "The Radiation Control for Health and Safety Act of 1968". The instrument is intended to provide the measurement capability required for the enforcement of this performance standard, but may be employed for a wide range of general-purpose applications.

The instrument of the present invention can be constructed so as to be capable of measuring DC voltage and AC voltage and frequency over a relatively wide frequency range, for example, 16 to 1600 Hz; with input signals between 60 and 600 volts, the maximum voltage error can be held to ±0.2 volt over this frequency range; from 16 to 100 Hz, the instrument can compute the RMS value of the input voltage for each cycle with a frequency error of less than ±0.1 Hz. The instrument can measure the maximum and minimum RMS voltage over the measurement interval employing a general procedure described in FDA report #FDA 74–8025, "A line Voltage Monitor for Determining AC Supply Regulation to a Diagnostic X-ray Source". In addition, the instrument can provide an on-line display of the input voltage and compute and display percent regulation from the measured maximum and minimum voltage values.

The instrument incorporates analog and digital circuitry and microcomputer ($\mu$C) hardware and software to achieve high accuracy, high speed, and minimal loss of data. The instrument comprises a microcomputer and remaining circuitry serving in input data to an output data from said microcomputer. Analog input circuitry attenuates and squares the input voltage. A voltage-to-frequency (V/F) converter produces logic pulses at a rate proportional to the squared signal. A 16-bit counter integrates $V^2$ by accumulating pulses from the V/F converter.

A second 16-bit counter increments at a 1 MHz rate to determine the cycle period of the input in microseconds. The dedicated microcomputer ($\mu$C) divides $\int V^2$ by the period and then takes the square root, yielding the RMS value of the input voltage. A switch may be set so that the $\mu$C inverts the cycle period to determine the input frequency rather than the RMS voltage.

The AC input signal is assumed to exhibit two zero-crossings per cycle. (Processing of DC signals will be explained later). A comparator detects negative zero-crossings of the input and triggers a timing control. When this occurs, the timing control first causes the contents of both 16-bit counters to be stored in latches and then resets the counters. At the same time the counters are reset, the $\mu$C is interrupted and responds by reading the contents of both 16-bit latches. The latch on the signal channel will contain $$\int_0^{nT} V^2(t)dt$$

and the other latch will contain nT, a multiple of the signal period. Possible values of n are 1, 2, 4, 8, and 16, determined by the setting of a switch, as will be later explained.

The $\mu$C maintains four storage locations for percent regulation (percent REG), maximum RMS voltage (VMAX), minimum RMS voltage (VMIN), and on-line RMS voltage ($V_{RMS}^{(t)}$). The RMS value computed every n cycles is stored in the $V_{RMS}^{(t)}$ location. VMAX is updated whenever the new $V_{RMS}^{(t)}$ value is greater than the previous VMAX, and VMIN is updated whenever the new $V_{RMS}^{(t)}$ value is less than the previous VMIN. The percent regulation is determined as follows: Percent REG=[(VMAX-VMIN)/VMIN] (100 percent). This value is recomputed each time that data is read from the latches whether or not VMAX or VMIN has been updated.

Approximately four times a second the $\mu$C reads the setting of a front panel switch which instructs it to display either percent REG, VMAX, $V_{RMS}^{(t)}$, or VMIN. The $\mu$C then stores the appropriate numerical value in the display drivers. The data is normally displayed in a four-digit format, with one digit to the right of the decimal point.

Accordingly, a main object of the invention is to provide a novel and improved instrument for measuring true-RMS line voltage, frequency, percentage regulation, and other required data, the instrument overcoming the deficiencies and disadvantages of prior art devices heretofore employed for such measurements.

A further object of the invention is to provide an improved portable apparatus for measuring true-RMS voltage, frequency and percent regulation of AC power supplies, the instrument being compact in size, being light in weight, being safe to use, and being capable of measuring AC voltage with a very low percent error over a wide range of voltages and frequency.

A still further object of the invention is to provide an improved line voltage monitor apparatus which is capable of measuring DC voltage and AC voltage and frequency over a wide range of frequency and voltages, which accurately measures maximum and minimum RMS voltage over a measurement interval, which has high resolution, which provides an on-line display of input voltage, and which computes and displays percent regulation from the measured maximum and minimum voltage values.

A still further object of the invention is to provide an improved line voltage monitoring apparatus which accurately measures maximum and minimum RMS voltage over a measurement interval, which incorporates improved analog and digital circuitry and microcomputer hardware and software to achieve high accuracy, high speed and minimum loss of data, which can measure DC voltage and AC voltage and frequency over a relatively wide range of voltage and frequency, and which accurately computes and displays percent regulation from measured maximum and minimum voltage values, as well as providing an on-line display of input voltage.

A still further object of the invention is to provide an improved line voltage monitor for determining AC supply regulation for diagnostic X-ray equipment and similar apparatus.

A still further object of the invention is to provide an improved line voltage monitoring instrument which is highly accurate, has high resolution and has a rapid response.

A still further object of the invention is to provide an improved AC line monitoring instrument which measures, computes and stores true-RMS line voltages and which measures and computes all necessary information for determining the adequacy of a power source to be used with diagnostic X-ray equipment, the instrument having means to provide a clear display of the information.

BRIEF DESCRIPTION OF THE DRAWINGS

Further objects and advantages of the invention will become apparent from the following description and claims, and from the accompanying drawings, wherein:

FIG. 3 is a detailed wiring diagram showing a further part of the input circuitry of the instrument of FIG. 1.

FIG. 3A is a detailed wiring diagram of another part of the instrument of FIG. 1, employed with the circuitry of FIG. 3.

FIG. 5 is a wiring diagram of the display circuitry forming part of the instrument of FIG. 1.

FIG. 5A is a wiring diagram of a typical driving circuit employed with the display circuitry of FIG. 5.

FIG. 9 is a memory map illustrating how the microcomputer memory is partitioned into four segments.

FIG. 10 illustrates a typical address layout.

FIG. 11 illustrates a floating-point format as employed with software for the microcomputer.

DESCRIPTION OF A PREFERRED EMBODIMENT

Figure 1:
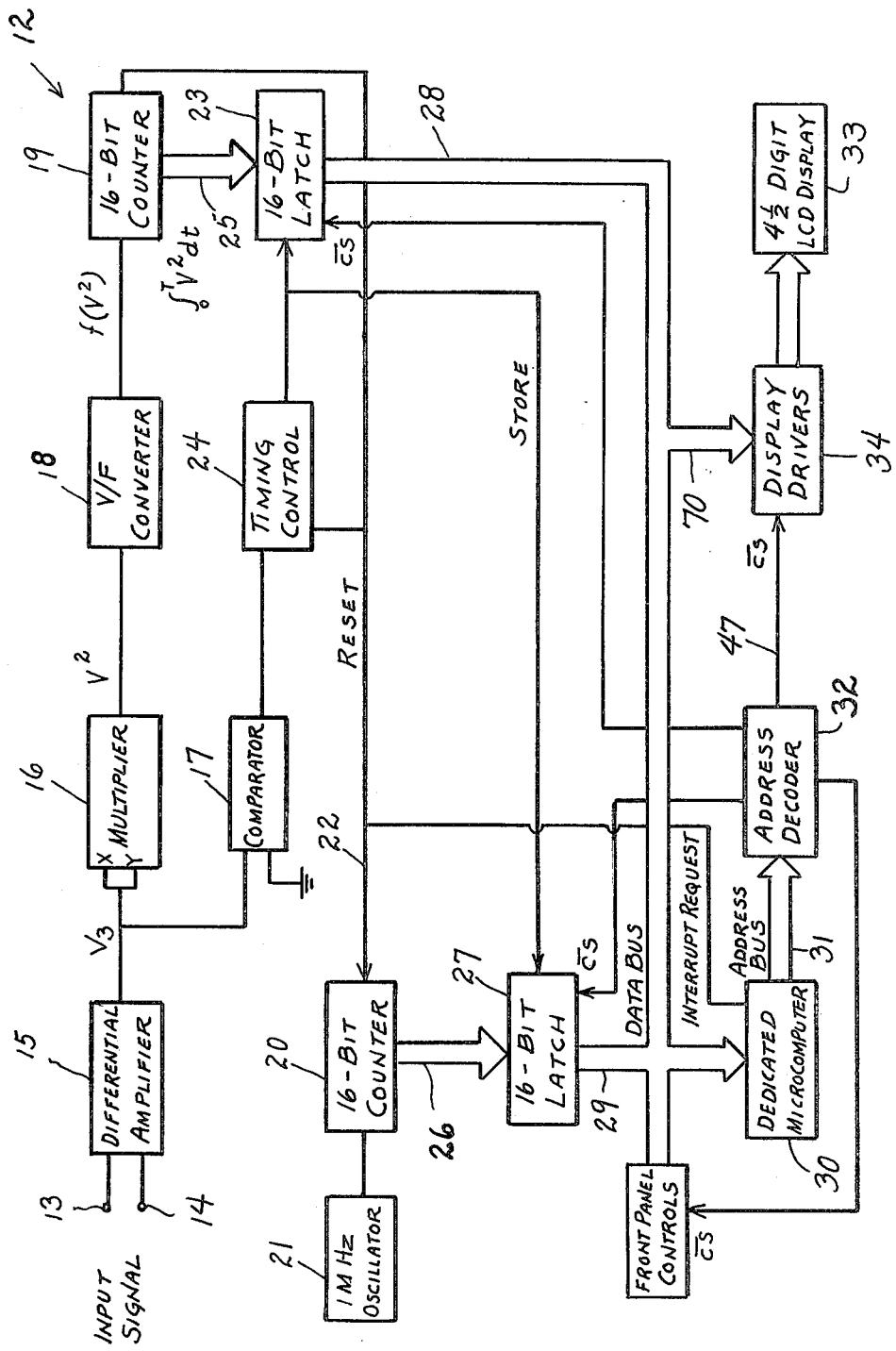
FIG. 1 is a detailed block diagram of an improved line voltage monitoring instrument according to the present invention.

Referring to the drawings, and more particularly to FIG. 1, the line voltage monitor is designated generally at 12. The monitor has input terminals 13, 14 leading to a differential amplifier 15 which derives the voltage signal $V_3$. The output of amplifier 15 is supplied to a squaring multiplier 16 and one input terminal of a comparator 17, the other input terminal thereof being grounded. The multiplier 16 derives the squared voltage signal $V^2$, which is furnished to a voltage-to-frequency converter 18 which produces a logic pulse train signal $f(V^2)$ which is fed to a first 16-bit counter 19. The logic pulses of the signal $f(V^2)$ are produced at a rate proportional to the squared voltage signal $V^2$. The 16-bit counter 19 integrates the $V^2$ signal by accumulating the pulses from the V/F converter 18. A second 16-bit counter 20 is incremented at a 1 MHz rate by a 1 MHz oscillator 21 to determine the cycle period of the input in microseconds. The reset line for the counters 19, 20 is shown at 22.

The first 16-bit counter 19 has a binary output 25 which is supplied to a 16-bit latch 23, time-controlled by comparator 17 via a timing control circuit 24, also reset from line 22. The second 16-bit counter 20 has a binary output 26 which is supplied to a 16-bit latch 27.

The binary output 28 of the 16-bit latch 23, representing the integrated $V^2$ value, and the binary output 29 of the second 16-bit latch 27, representing the cycle period T, are furnished to a dedicated microcomputer 30, which divides the integrated $V^2$ value by the period T and then takes the square root, yielding the RMS value of the input voltage in binary form. This value is then output at 70 and is subsequently displayed in the LCD display assembly, shown at 33, via display drivers, shown generally at 34. The address output at 31 is decoded by an address decoder 32 to supervise and control the flow of data on the data bus.

INPUT CIRCUITRY

Figure 2:
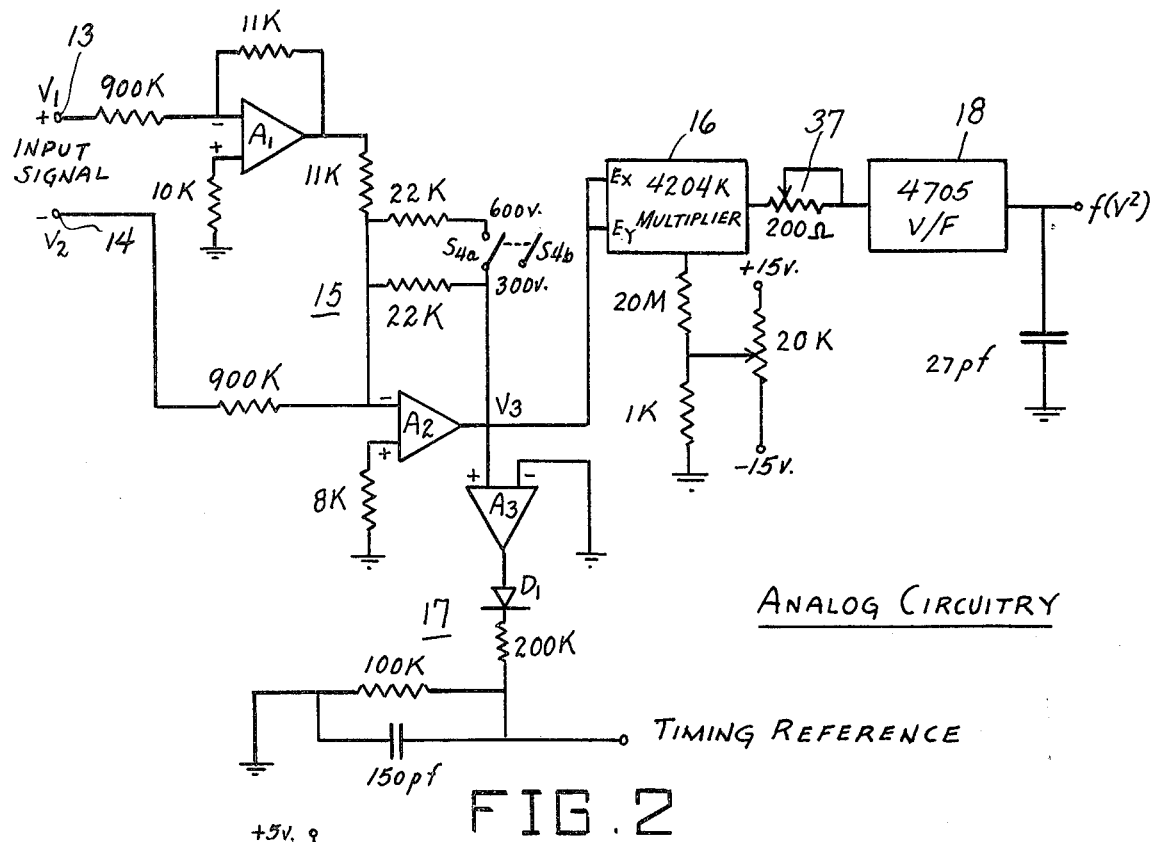
FIG. 2 is a detailed wiring diagram showing part of the analog input circuitry of the instrument of FIG. 1.

Referring to FIGS. 1, 2, 3 and 3A, it will be seen that the input circuitry comprises means to process the input signal, convert it to digital (binary) form, and to place the binary data on the microcomputer data bus 28 when requested by the microprocessor circuitry. The analog circuitry is shown in detail in FIG. 2. The differential amplifier 15 of FIG. 1 comprises operational amplifiers $A_1$ and $A_2$. The input resistance seen by $V_1$ and $V_2$ is greater than 900K. The output of amplifier $A_1$ is $(-1/81.8)V_1$. With switch $S_{4a}$ open (300-volt scale), the output of $A_2$ is $V_3$, where $V_3=(-1/40.9)V_2-2(1/81.8)V_1=(V_1-V_2)/40.9$. With switch $S_{4a}$ closed (600-volt scale), $V_3=(-1/81.8)V_2-(-1/81.8)V_1=(V_1-V_2)/81.8$. Amplifiers $A_1$ and $A_2$ are contained in a single SN72747 package. Not shown in FIG. 2 are respective offset adjustment trimpots for $A_1$ and $A_2$, which are adjusted to minimize the offset voltage of the amplifiers.

The output $V_3$ of the differential amplifier is squared by a Burr-Brown 4204K multiplier 16. The trim procedure used to adjust the offset and feedthrough of the multiplier is shown in FIG. 2. The output of the multiplier, which is $V_3/10)^2$, is converted to a train of TTL-compatible logic pulses approximately 350 nsec wide, having a frequency proportional to $(V_3/10)^2$. This conversion is performed by a Teledyne-Philbrick Model 4705 V/F converter 18. The 200 ohm trimpot 37 is used to adjust the gain of the V/F converter 18, and a trimpot, not shown, is used to adjust the offset for best performance.

Amplifier $A_3$ (an MC1456 operational amplifier), diode $D_1$, two resistors, and one capacitor comprise the low-noise comparator 17. When the input signal ($V_1-V_2$) is positive, the timing reference is a logic "1". When the input signal is negative, the timing reference is a logic "0". The timing reference, as well as the V/F converter output ($f(V^2)$) are connected to the circuitry of FIG. 3, which comprises the digital portion of the input circuitry.

Figure 8:
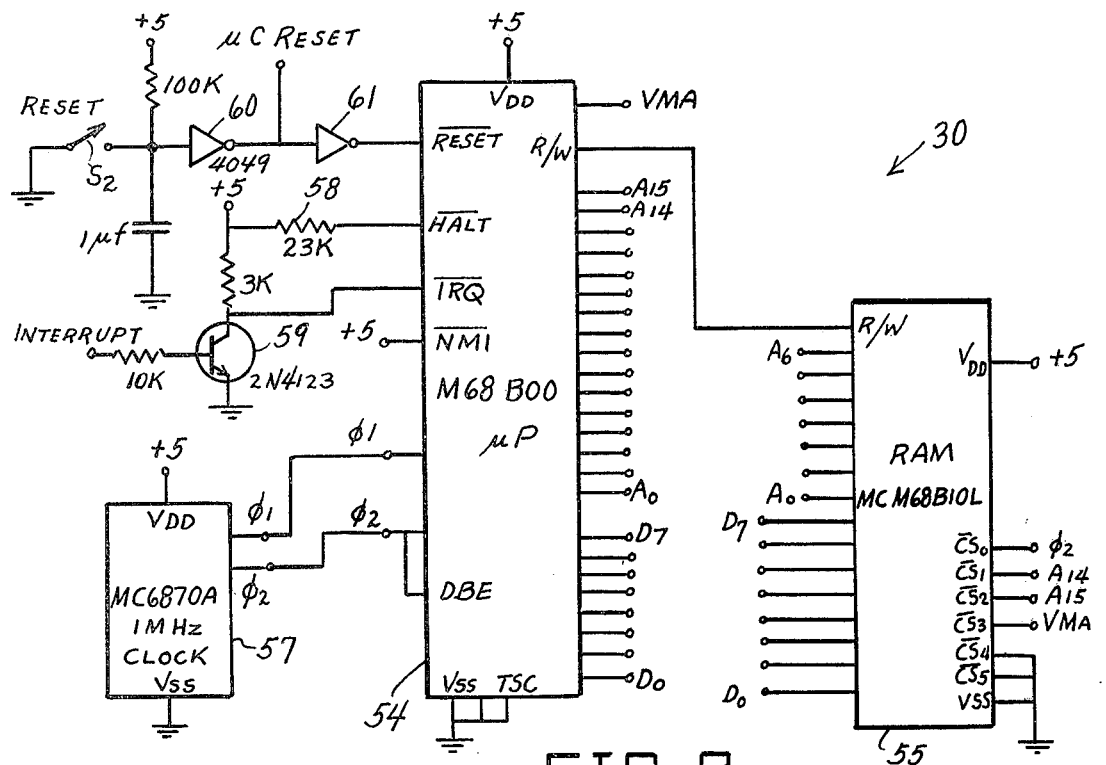
FIG. 8 is a wiring diagram showing part of the microcomputer hardware employed in the instrument of FIG. 1.

Data input to the microcomputer 30 each sample period (nT) includes the contents of the two 16-bit counters 19, 20 and the settings of panel switches $S_9$ and $S_3$-$S_6$ (FIGS. 2 and 3A). When switch $S_7$ (the AC/DC switch, FIG. 3) is in the AC position, the sample period is derived from the timing reference signal generated by the circuitry of FIG. 2. For the measurement of DC signals (when switch $S_7$ is in the DC position), a timing reference of 61 Hz is provided by the $Q_{14}$ output of a 14-bit binary counter 35(MC14020 in FIG. 3) which is clocked by $\phi_1$ of the microcomputer clock 57 (FIG. 8). This frequency is generated to drive the liquid crystal display and thus is available. Conveniently, 61 Hz is within the 1 cycle-per-sample range (see Table I below).

The timing reference selected by switch $S_7$ (FIG. 3A) clocks a 4-bit binary counter 38 ($\frac{1}{2}$ MC14520) which provides frequency division by 2, 4, 8, and 16. The setting of the cycles-per-sample switch $S_8$ (FIG. 3A) determines the number of cycles (n) of the input signal in each sample period by triggering a one-shot, $OS_1$, at 1, $\frac{1}{2}$, $\frac{1}{4}$, $\frac{1}{8}$, or 1/16 times the frequency of the input signal. As a result, the microcomputer 30 computes the RMS voltage of the input signal every n cycles. Selection of n greater than 1 enables the instrument to measure RMS voltage at frequencies greater than 100 Hz (up to 1.6 kHz for the maximum selected value of n).

The frequency range over which the instrument operates properly for each setting of switch $S_8$ is listed below in Table I. For each entry, the lower frequency limit prevents overflow of the period counter and the upper limit assures adequate resolution in the $\int V^2$ counter for $\pm 0.2$ volt accuracy above 60 volts on the 300-volt scale and 120 volts on the 600-volt scale. Observation of the upper frequency limit will also insure the normal rate of data output to the liquid crystal display from the microcomputer. An input signal frequency below the lower limit of a range will cause overflow in the period counter. A signal frequency above the upper limit will cause the display to update very infrequently, or not at all.

TABLE I

| $S_8$ setting (Cycles per sample) | Recommended frequency range (Hz) |
|---|---|
| 1 | 16–100 |
| 2 | 32–200 |
| 4 | 65–400 |
| 8 | 125–800 |
| 16 | 350–1600 |

The signal selected by switch $S_8$ triggers the one-shot $OS_1$ (FIG. 3) on each negative transition. The output pulse of $OS_1$, which is approximately 1 microsecond wide, signals an end to the most recent measurement period by stopping the two 16-bit counters 19, 20 ($\int V^2$ and nT) and storing the counter contents in the latches 23, 27. The one-shot $OS_2$ is triggered by the falling edge of the Q output of $OS_1$. The output pulse of $OS_2$, approximately 1.5 microseconds wide, signals the beginning of a new sample period by resetting the 16-bit counters 19, 20. In addition, an interrupt latch flipflop 39 ($\frac{1}{2}$ CD4013, FIG. 3) is set to signal the processor that data is ready for input.

The settings of switches $S_3$-$S_6$ and $S_9$, and the state of the overflow flipflop 40 (FIG. 4) are latched by latches 41, 42 (FIG. 3A) each microprocessor clock cycle so that the signals read by the microcomputer do not change during data input. The codes corresponding to the positions of switches $S_3$-$S_6$ and $S_9$ are listed below in Table II. The codes for switch $S_6$ are generated using the diode-resistor logic shown at 43 in FIG. 3A.

TABLE II

| Switch | Code | Function |
|---|---|---|
| $S_3$ Sample/Hold | 0 | Hold |
| | 1 | Sample |
| $S_{4b}$ Scale | 0 | 300 v. scale |
| | 1 | 600 v. scale |
| $S_5$ Test Display | 0 | Test display |
| | 1 | Normal display |
| $S_6$ Display | 00 | Display VMIN |
| | 01 | Display V(t) |
| | 10 | Display VMAX |
| | 11 | Display percent REG |
| $S_9$ Compute | 0 | Compute Voltage |
| | 1 | Compute Frequency |

It is to be noted that $S_{4a}$-$S_{4b}$ is a ganged two-pole switch. One pole controls the gain of the differential amplifier 15 and the other instructs the microcomputer to compensate for the frontend gain accordingly.

Figure 4:
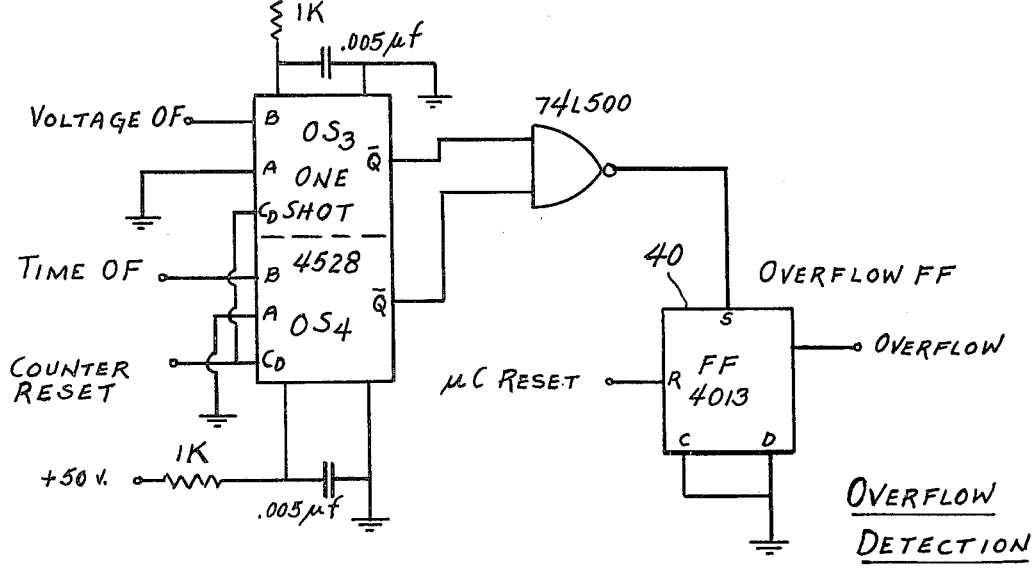
FIG. 4 is a wiring diagram of the overflow detection circuitry employed in the instrument of FIG. 1.

The overflow signal is produced by the circuit of FIG. 4 from negative transitions of the most significant bits of the 16-bit counters 19, 20 (voltage and time overflow). The voltage and time overflow bits may exhibit negative transitions under normal conditions during reset of the 16-bit counters 19, 20. To distinguish between normal and overflow transitions, the signal used to clear the counters is inverted and applied to the clear inputs of one-shots $OS_3$ and $OS_4$. In this manner, only an actual counter overflow will trigger the corresponding one-shot and set the overflow flip-flop 40. The overflow flipflop 40 is cleared when the microcomputer is reset by switch $S_2$ (see below).

Data is input into the microcomputer 30 from the circuitry of FIG. 3 by enabling the tri-state output of the MC14076B latches (shown at 23, 27), which places the data on the microcomputer data bus 28, 29. The B-series CMOS used has sufficient output current to drive the data bus. The latch outputs are enabled by the M5000 . . . M5004 signals, which are generated by the address decoder 32. "500X" corresponds to the address output by the microcomputer when reading in the data. An address of 5005, which is put out by the microcomputer to acknowledge that the interrupt is being handled, resets the interrupt latch 39.

DISPLAY CIRCUITRY

The liquid crystal display 33 is driven by and displays the contents of a driver assembly 34 comprising two CD4054 LCD drivers 44 and four CD4056 LCD drivers 45 (see FIG. 5). The backplane is driven between +5 and −10 volts at the 61 Hz driving frequency generated by the MC14020 14-bit counter 35 shown in FIG. 3. Segments of the display are transparent when driven in phase and are opaque when driven out of phase with the backplane drive signal. The 45D7R03 LCD display 33 provides good legibility with low power consumption.

Figure 6:
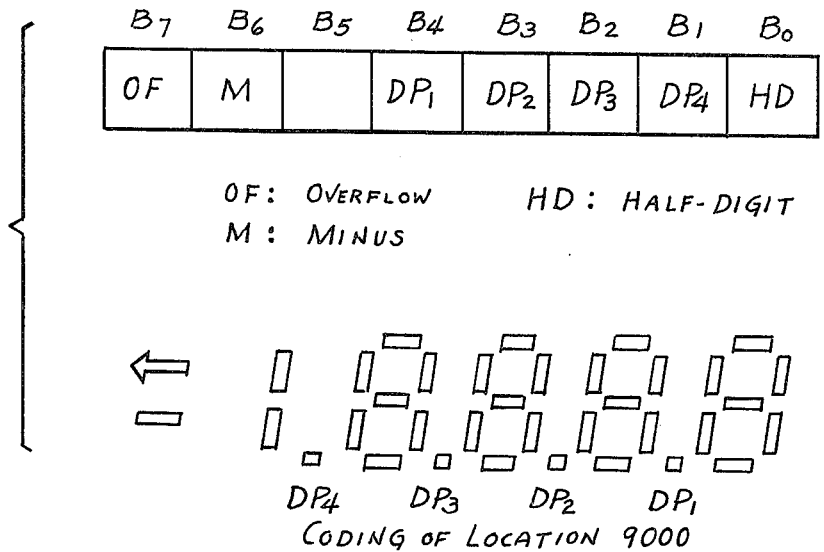
FIG. 6 is a coding diagram for coding decimal point location, minus sign, overflow indication and half-digit in the instrument.

The four least significant digits of the display are output two digits at a time when the processor stores data in the CD4056 drivers 45, configured at locations 9001 and 9002. This is accomplished using a CMOS replica of the microcomputer data bus ($CD_0$ . . . $CD_7$) generated by 74LS367 buffers 46(FIG. 5A) and 1000-ohm pullup resistors 47. The CD4056 drivers 45 each contains a 4-bit latch for storing 1 BCD digit, and a binary-to-seven segment decoder for driving the display. When location 9001 or 9002 is addressed by the microcomputer 30, a store pulse is generated by the address decoder 32 to strobe the appropriate latches, via a line 47 in FIG. 1. The decimal point location, minus sign, overflow indication, and half-digit are all coded in location 9000, as shown in FIG. 6. Data output by the microcomputer 30 to the CD4054 drivers, configured at location 9000, is stored in the internal latches of the CD4054 display drivers 44.

Figure 7:
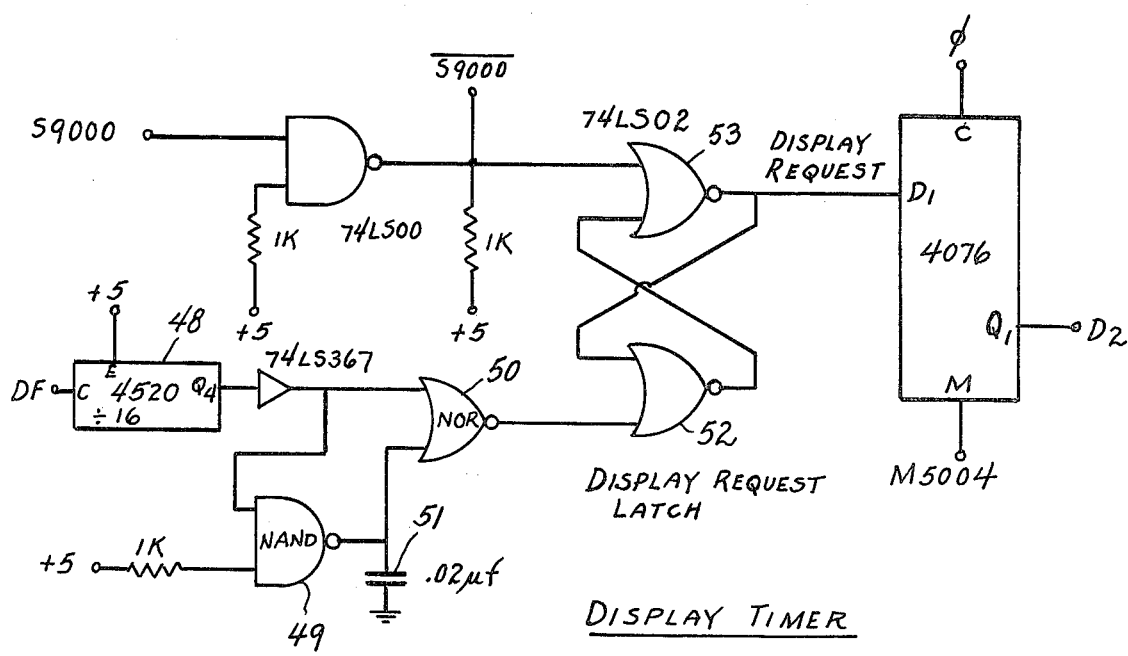
FIG. 7 is a wiring diagram of the display timing circuit employed in the instrument of FIG. 1.

A display request is generated approximately four times a second by the circuitry shown in FIG. 7. The 61 Hz driver frequency (DF) signal is divided by 16, using a MC14520 binary counter 48. Each negative-going transition of the $Q_4$ output of the counter 48 triggers a simple one-shot comprising a NAND gate 49, a NOR gate 50, and a capacitor 51. This in turn sets the display request latch comprising two NOR gates 52, 53, causing the display request signal to go high. The display request is cleared (reset) when data is subsequently stored in location 9000. In addition to the states of switches $S_9$ and $S_3$-$S_6$ and of the overflow flipflop 40, the state of the display request is made available to the microcomputer 30 when it reads location 5004. Under the constraints of Table I, each display request is serviced by the microcomputer.

MICROCOMPUTER HARDWARE

Figure 8A:
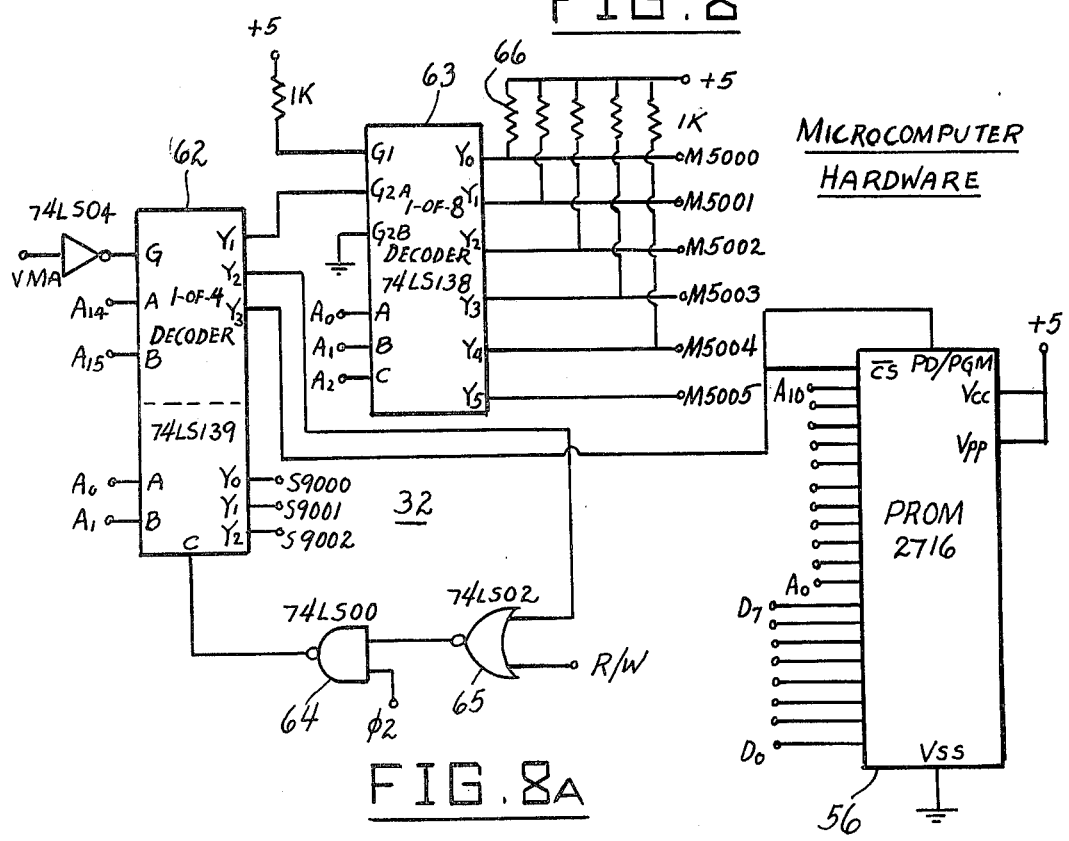
FIG. 8A is a wiring diagram of another portion of the microcomputer hardware.

Referring to FIGS. 8 and 8A, the microcomputer 30 comprises an M68B00 microprocessor 54; an MCM68B10L 128×8 random access memory (RAM), shown at 55; 2 K×8 programmable, read-only memory (PROM), shown at 56; and an MC6870A 1 MHz crystal oscillator 57. The address ($A_0$ . . . $A_{15}$), data $D_0$ . . . $D_7$) and control lines are connected according to the correspondingly labelled terminals in FIGS. 8 and 8A. The halt line of the processor 54 is tied high, with a pull-up resistor 58, so that the processor may be halted by a clip-on logic analyzer probe during trouble shooting.

The interrupt signal from the interrupt latch 39 (FIG. 3) is inverted by a single transistor stage 59 to provide the proper signal polarity and sink current for the $\overline{IRQ}$ input of the microprocessor. An RC circuit on the reset input of the processor holds the reset line low for multiple machine cycles after either a power-up or depression of switch $S_2$. The RC stage is buffered by CMOS inverters 60, 61 to reduce loading effects on the time constant and to square up the signal.

ADDRESS DECODER

Referring to FIG. 8A, the address decoder 32 comprises 74LS139 and 74LS138 decoders 62, 63 and several gates 64, 65. Low-power schottky (LS) TTL is used rather than CMOS for speed in address decoding. 1000-ohm pull-up resistors 66 are used wherever the microprocessor or any LSTTL circuitry drives CMOS, such as the outputs of the 1-of-8 decoder 63.

Half of the 74LS139 (dual 1-of-4) decoder 62 is used to partition the memory into 4 segments: RAM, input, output, and PROM (see FIG. 9). When $A_{15}A_{14}$ is 01 (binary), $Y_1$ goes low, enabling the 74LS138 (1-of-8) decoder 63. The 74LS138 decoder 63 subsequently decodes the three least significant address bits to select an 8-bit byte or to reset the interrupt latch.

When $A_{15}A_{14}$ is 11, $Y_3$ goes low, enabling the PROM 56. When $A_{15}A_{14}$ is 10, $Y_2$ goes low. $Y_2$ is subsequently gated with the $\phi_2$ clock and "read/write" (R/W) to enable the second half of 1-of-4 decoder 62. Store pulses are then generated for the three bytes of display latches (S9000 . . . S9002) as determined by the $A_0$ and $A_1$ address lines. The MCM68B10L (RAM 55) contains sufficient decoding logic to detect the 00 state of $A_{15}A_{14}$. Thus, it is not necessary to use the $Y_0$ output of the first 1-of-4 decoder 62.

The addresses are assigned so that there would be no interference with memory resident in the software development facility used in writing and testing the line voltage monitor program. For this reason, several "don't-care" bits are assigned to logic "1" in the input, output, and PROM address designations (FIG. 10). Hexadecimal notation is used throughout in referring to the address of memory locations.

MICROCOMPUTER SOFTWARE

The line voltage monitor program occupies 1¾ k of ROM, the majority of which consists of general-purpose library subroutines. Less than ½ k of ROM is occupied by the software specific to the line voltage monitor. General-purpose subroutines provide such functions as basic arithmetic, square-root, the format conversion. The LVM-specific routines read data from the latches designated M5000 through M5004, process the data, and store the results in the display circuitry located from S9000 through S9002.

When the processor is interrupted at the end of each sample period (nT), it responds within 1 msec under normal conditions. In response, the processor first sets the interrupt mask so that it can process one sample completely before reading in another. This is a preventive measure only. Successive samples do not interfere under the voltage and frequency constraints of Table I. After setting the interrupt mask, the microprocessor acknowledges the interrupt by addressing location 5005. The setting of the sample/hold switch ($S_3$) is then read from location 5004. If $S_3$ is set to hold, the sample is not processed and the microprocessor resumes the display routine described below. If $S_3$ is set to sample, however, the microprocessor proceeds by reading $\int V^2$ from locations 5000 and 5001 as a 16-bit integer and converting it to a floating-point binary number.

The floating-point format used is shown in FIG. 11, and some examples are listed in Table III, below. Three bytes are used to represent each number: one byte for the two's complement exponent, one sign bit, and 15 bits for the straight-binary mantissa. The mantissa is always normalized such that the most significant bit is a "1" except for the number zero, which is represented as 80 0000(+0) or 80 0000(−0). The binary point is assumed to be to the left of the most significant mantissa bit. As a result, the (nonzero) mantissa alone represents a fraction between 0.50 and 0.99997 (decimal). This floating-point format provides a dynamic range of $10^{-38}$ to $10^{+38}$ and a resolution of 0.00305 percent (1 part in 32,768).

TABLE III

| Floating-point notation | Decimal equivalent |
|---|---|
| 80 0000 | 0.0000 |
| 01 4000 | 1.0000 |
| 01 C000 | −1.0000 |
| 00 4000 | 0.5000 |
| 00 6000 | 0.7500 |
| FA 51EC | 0.0100 |
| F0 53E3 | $1.0000 \times 10^{-5}$ |
| 04 5000 | 10.000 |
| 07 6400 | 100.00 |
| 22 4A81 | $1.0000 \times 10^{10}$ |

After $\int V^2$ is converted to floating point, the period nT is read from locations 5002 and 5003 and also converted to floating point. The setting of $S_9$ is then read drom location 5004. If $S_9$ is a logic "1", the period nT is inverted to determine F/n, the frequency of the input signal divided by n. In this mode, the values displayed by the LVM are actually FMIN, F(t), FMAX, and % REG of the frequency. FMIN, FMAX, and % REG of the frequency are determined in a manner analogous to the determination of VMIN, VMAX, and % REG of voltage (see below).

If $S_9$ is a logic "0", the LVM continues the calculation of RMS voltage by performing the division $\int V^2/nT$ and then taking the square root. The setting of the scale switch $S_{4b}$ is read from location 5004. The result of the square-root operation is multiplied by 409 is $S_{4b}$ is set to the 300 volt scale, and by 818 if $S_{4b}$ is set to the 600 volt scale. This compensates for the division by 10 performed by the 4204K multiplier 16 of FIG. 2 and the attenuation by 1/40.9 (for the 300 volt scale) or 1/81.8 (for the 600 volt scale). This completes the computation of the RMS value of one sample of the input voltage.

The RMS value computed from the input sample is stored in a location reserved for V(t) in the RAM 55. V(t) is then compared to the previous maximum and minimum. If $V_{RMS}(t)$ is larger than the previous maximum or smaller than the previous minimum, that value is replaced by storing $V_{RMS}(t)$ in the appropriate RAM location reserved for VMAX or VMIN. If $V_{RMS}(t)$ is between VMIN and VMAX, the previous values remain unchanged. The percent regulation is computed from VMAX and VMIN, using the formula previously given above, and stored in a RAM location reserved for percent REG.

After computing percent regulation, the processor clears the interrupt mask and resumes its normal activity, the output of data to the display. The microprocessor monitors location 5004, awaiting a display request. When one is detected, the state of the test display switch $S_5$ is read from location 5004. If $S_5$ is a "1", the display test sequence is not executed. If $S_5$ is a "0", the display is tested by first turning on and then off all segments of interest. A display of ←−1.8.8.8.8 is produced by storing FF 8888 in locations 9000 . . . 9002. Then the display is blanked by storing 00 FFFF in the same location. The display test sequence executes in approximately two seconds when the processor is in the hold mode or the input frequency is close to the lower limit of Table I. The same sequence can require over 8 seconds for execution when the input frequency is close to the upper limit of Table I.

Whether $S_5$ was in a "0" or "1" state, the processor proceeds by reading the display code generated by $S_6$ from location 5004. The quantity selected for display is read from its reserved location in RAM 55 and converted from floating-point-binary to binary-coded-decimal (BCD) notation. The status of the overflow flipflop 40 is then read from location 5004. If counter overflow has occurred, an overflow indication is added to the display code (FIG. 6). The BCD number is then stored in the latches of the display drivers at locations 9000, 9001 and 9002 (FIG. 5). Again, storage of data in location 9000 resets the display request latch. The processor returns to monitoring location 5004 for the next display request.

In displaying numerical data, a distinction is made between numerical overflow and counter overflow. Although the overflow indication (arrow) is displayed in either case, conversion of a number larger than 9999 to BCD results in a display of ←−19999. Counter overflow can occur when the frequency of the input signal is below the lower limits presented in Table I. This condition is latched; therefore, loss of several cycles of the input signal (as from power line irregularities or intermittent connections) can cause an overflow indication to be displayed along with a valid VMAX or $V_{RMS}(t)$. In general, however, counter overflow may be displayed along with a valid or invalid numerical value. Once the input frequency has been restored to within the limits of Table I, resetting the instrument will clear the overflow indication.

Actuation of the reset switch $S_2$ at any time resets the microprocessor and prevents execution of any instructions. When $S_2$ is released, VMIN is initialized to the largest number representable in the floating-point format and the VMAX is initalized to zero. This assures that the first sample after a reset will replace both the initialized VMAX and VMIN. The effect of subsequent samples has been described above.

From the above description it will be seen that the incorporation of a microprocessor into an instrument for measuring AC voltage can provide greatly improved accuracy as over previous versions of such instruments, greatly expanded frequency range over which such accuracy can be obtained, and permits the inclusion of such features as display test, overflow indication, frequency measurement, and computation of percent regulation. Another key feature is fast response. The bandwidth of the front end is greater than 2.5 kHz, and the instrument is capable of computing frequency or RMS voltage for each cycle of the input signal from 16 to 100 Hz, 60 to 600 volts. The instrument is also capable of measuring DC voltage from 60 to 800 volts. The instrument can be packaged in a relatively small carrying case and is relatively light is weight.

Although the instrument has been configured to measure AC line voltage, changing the gain of the differential amplifier 15 and the corresponding correction factor would permit its use over a wide range of input voltages. Also, it would be a relatively simple matter to output the data bus and the S9000, S9001 and S9002 lines to a digital printer for hard copy of the measured data. The instrument could easily be adapted to measure AC current or, with the proper transducer, any physical quantity for which maximum, minimum, or percent change information is of interest.

Attached hereto is a listing of the programs embodied in the program memory of the invention.

What is claimed is:

1. A line voltage monitor comprising a pair of input terminals, analog input circuit means connected to said input terminals and including multiplier means for squaring an input signal voltage V(t) applied to said terminals, voltage-to-frequency converter means producing logic pulses at a rate proportional to the square of said signal voltage, $V^2(t)$, first counter means for integrating the pulses to derive a pulse accumulation representing the integral of said squared signal voltage, over n cycles $$\int_0^{nT} V^2(t)\, dt,$$

where n is an integer equal to or greater than 1, second counter means for determining the cycle period T of the input signal, computer means to divide said pulse accumulation by n times said cycle period to derive the RMS value $$\left[ \frac{1}{nT} \int_0^{nT} V^2(t) dt \right]^{\frac{1}{2}}$$

of said input signal voltage, V(t) and means to display said derived RMS value; whereby by making n equal to 1, said derived RMS value is based on each individual cycle of said input signal voltage.

2. The line voltage monitor of claim 1, and wherein said input circuit means comprises differential amplifier means connected to said input terminals and having an output terminal for providing a resultant line voltage signal representing the difference between the voltage potentials applied to said input terminals, comparator means for generating a periodic timing reference signal from said resultant line voltage signal, and means to select a sample period as said integral multiple n of the cycle period T in accordance with the counts of said timing reference signal.

3. The line voltage monitor of claim 2, and means to at times substitute a fixed-frequency signal for said timing reference signal.

4. The line voltage monitor of claim 2, and period counter means, circuit means to clock said period counter means with said timing reference signal, and means to provide selective line frequency division to determine said integral multiple n, and hence the number of cycles of the input signal V(t) in each sample period.

5. The line voltage monitor of claim 4, and means to detect overflow of said period counter means when the input signal frequency is below a selected frequency range corresponding to said integral multiple, and means to display the overflow state.

6. The line voltage monitor of claim 1, and means to at times invert the cycle period value to determine the input frequency, and means to display the input frequency value.

7. The line voltage monitor of claim 1, and wherein said analog input circuit means includes comparator means to detect negative zero-crossings of the input signal, timing control means connected to said comparator means, and means to latch the contents of the first and second counter means and then reset the counter means responsive to detection by the timing control means of negative zero-crossings of said input signal.

8. The line voltage monitor of claim 7, and means to request that the computer means read the latched contents at the same time as both counter means are reset.

9. The line voltage monitor of claim 1, and wherein said computer means includes four storage locations, respectively for percent regulation (percent REG), maximum RMS voltage (VMAX), minimum RMS voltage (VMIN), and on-line RMS voltage $V_{RMS}(t)$, $V_{RMS}(t)$ location, means to update the stored VMAX value when a new $V_{RMS}(t)$ value exceeds its previous value, means to update the stored VMIN value when a new $V_{RMS}(t)$ value is less than its previous value, and means to compute the percent regulation according to the formula:

$$\text{Percent REG} = \frac{\text{VMAX} - \text{VMIN}}{\text{VMIN}} \times 100 \text{ percent.}$$

10. The line voltage monitor of claim 9, and wherein said analog input circuit means includes comparator means to detect negative zero-crossings of the input signal, timing control means connected to said comparator means, and means to latch the contents of the first and second counter means and then reset the counter means responsive to detection by the timing control means of negative zero-crossings of said input signal, and wherein the computer means includes means to read the latched data and to recompute the percent REG each time the latched data is read.

11. The line voltage monitor of claim 1, and wherein said input circuit means comprises differential amplifier means connected to said input terminals and having an output terminal for providing a resultant line voltage signal representing the difference between the voltage potentials applied to said input terminals, a squaring multiplier, circuit means connecting said resultant line voltage signal to said squaring multiplier for squaring said resultant line voltage signal, comparator means connected to the output of the differential amplifier means for generating to logic "0" when said resultant line voltage signal goes negative and a positive timing reference signal pulse when said resultant line signal is positive, whereby to establish said cycle period T of said resultant line voltage signal, sample period adjusting means connected to the output of the comparator means for generating sample period timing signal pulses which have a sample period nT which is said integral multiple n of said cycle period T, means to latch the first and second counter means at the end of each sample period nT, with the respective pulse accumulations representing said integral of the squared signal voltage and the sample period nT stored therein, and means provided in said computer means to derive said RMS value of the input signal voltage by dividing the latched contents of the first counter means by the latched contents of the second counter means.

12. The line voltage monitor of claim 11, and wherein larger integers n are used for respective increasing line voltage frequency ranges.

13. The line voltage monitor of claim 12, and wherein the integers n are respectively 1, 2, 4, 8 and 16.

14. The line voltage monitor of claim 12, and wherein the sample period adjusting means includes pulse counting means connected to the output of said comparator means and one-shot latching means connected to said first and second counter means, and adjustable switching means connected between said last-named pulse counting means and said one-shot means for selecting said integral multiple n used to trigger said one-shot means.

15. The line voltage monitor of claim 14, and a clock-controlled steady-frequency pulse source, and switch means to at times connect said clock-controlled source to said last-named pulse counting means in place of said comparator means.

16. The line voltage monitor of claim 14, and second one-shot means triggered by the falling edge of the output of said first-named one-shot means, and means responsive to the output of said second one-shot means to reset the first and second counter means and to signal the computer means that data is ready for input.

* * * * *